(12) United States Patent
Yeh

(10) Patent No.: US 6,959,899 B2
(45) Date of Patent: Nov. 1, 2005

(54) ATTACHMENT ASSEMBLY FOR PERSONAL DIGITAL ASSISTANT

(76) Inventor: Ta Kuang Yeh, P.O. Box 26-757, Taipei (TW) 106

( * ) Notice: Subject to any disclaimer, the term of this patent is extended or adjusted under 35 U.S.C. 154(b) by 280 days.

(21) Appl. No.: 10/395,404

(22) Filed: Mar. 21, 2003

(65) Prior Publication Data

US 2004/0184223 A1   Sep. 23, 2004

(51) Int. Cl.[7] .............................................. A47B 91/00
(52) U.S. Cl. ............................ 248/346.03; 248/316.4; 379/446
(58) Field of Search ............................. 248/309.1, 313, 248/316.4, 316.8, 446, 426, 454, 455; 379/446, 379/426, 454, 455

(56) References Cited

U.S. PATENT DOCUMENTS

| 5,555,302 | A | * | 9/1996 | Wang | ........................ 379/446 |
|---|---|---|---|---|---|
| 5,787,168 | A | * | 7/1998 | Lien | ........................... 379/455 |
| 5,903,645 | A | * | 5/1999 | Tsay | ........................... 379/455 |
| 6,229,893 | B1 | * | 5/2001 | Chen | .......................... 379/454 |
| 6,438,229 | B1 | * | 8/2002 | Overy et al. | ................. 379/446 |

* cited by examiner

Primary Examiner—Ramon O Ramirez

(57) ABSTRACT

An attachment assembly for a personal digital assistant (PDA) includes a first cover portion, a second cover portion and an attachment unit. At a front surface of the first cover portion is formed a plurality of fastening holes to adequately locate attachment arms for holding the PDA. The attachment unit includes an attachment body. A projection piece, an opened ring, a rod and a stopper piece are formed at a first side of the attachment body to mount with to a gear, a lock, a pressing button, a fastening frame, a first short resilient member and a second short resilient member. A slot is formed at a second side of the attachment body to receive the fastening frame and the long resilient member. By pressing down the pressing button, the lock, the gear and the long resilient member interact with one another to achieve the attachment of the PDA.

4 Claims, 8 Drawing Sheets

ATTACHMENT ASSEMBLY FOR PERSONAL DIGITAL ASSISTANT

BACKGROUND OF THE INVENTION

1. Field of the Invention

The present invention relates to an attachment assembly for personal digital assistant and, more particularly, an user-friendly attachment assembly that can fasten a PDA in different types of car vehicles.

2. Description of the Related Art

A personal digital assistant (PDA) has recently become a popular portable device. The volume of the PDA is far smaller than that of a traditional portable computer. Therefore, it can be advantageously operated in a user's palm.

The PDA can store a substantial amount of data such as schedule data, address book data, to-do list data, and a note pad data, and further provides diversified functions as well. The manipulation of the PDA usually is easy to learn, and it may be used as a very convenient electronic organizer. For example, the PDA allows to quickly search and display personal information such as telephone numbers after a correct instruction is inputted.

In addition to traditional functions of organizer assistant, data further call be downloaded from a computer. For example, the user can transfer e-mails that cannot be immediately read from a computer to the PDA, and treat these emails later. Furthermore, software applications such as calculator, an electronic map, a document processing system, an electronic book, a palm game, and global positioning system (GPS) may be further installed in the PDA. In addition, the PDA may be further provided with a wireless communication system and thus can be used as a pager or receive various online information such as finance, traffic, weather, and news information. In the future, it is expected that the PDA be compatible with a cellular phone.

However, the prior art does not provide an attachment device that can securely and easily fasten the PDA in a vehicle, which may cause damages of the PDA when shocks or accidents happen.

SUMMARY OF THE INVENTION

It is therefore an object of the invention to provide an attachment assembly that can securely fasten the PDA and allows a vehicle driver to easily operate the PDA to perform any desirable function such as calculating function, electronic map function, document processing function, electronic book function, or real-time receive information such as finance, traffic, weather and news information.

In order to achieve the above and other objectives, a PDA attachment assembly of the invention comprises a first cover portion, a second cover portion and an attachment unit. A personal digital assistant (PDA) is held at a front surface of the first cover portion. To accommodate different sizes of PDA, a plurality of fastening holes are formed on the front surface to adequately locate attachment arms used to support the PDA. A backside of the second cover portion is fastened to a proper location of a vehicle via an adequate fastener. The attachment unit includes an attachment body that has a first side and a second side, wherein a projection piece, an opened ring, a rod and a stopper piece are formed at the first side of the attachment body to mount with a gear, a lock, a pressing button, a fastening frame, a first short resilient member and a second short resilient member. A slot is formed at the second side of the attachment body, and a stud is formed on an inner bottom of the slot. The slot receives the long resilient member and the fastening frame that is positioned by the long resilient member. By pressing down the pressing button, the lock, the gear and the long resilient member interact with one another to achieve the attachment of the PDA.

To provide a further understanding of the invention, the following detailed description illustrates embodiments and examples of the invention, this detailed description being provided only for illustration of the invention.

BRIEF DESCRIPTION OF THE DRAWINGS

The drawings included herein provide a further understanding of the invention. A brief introduction of the drawings is as follows.

DETAILED DESCRIPTION OF THE EMBODIMENTS

Figure 1:
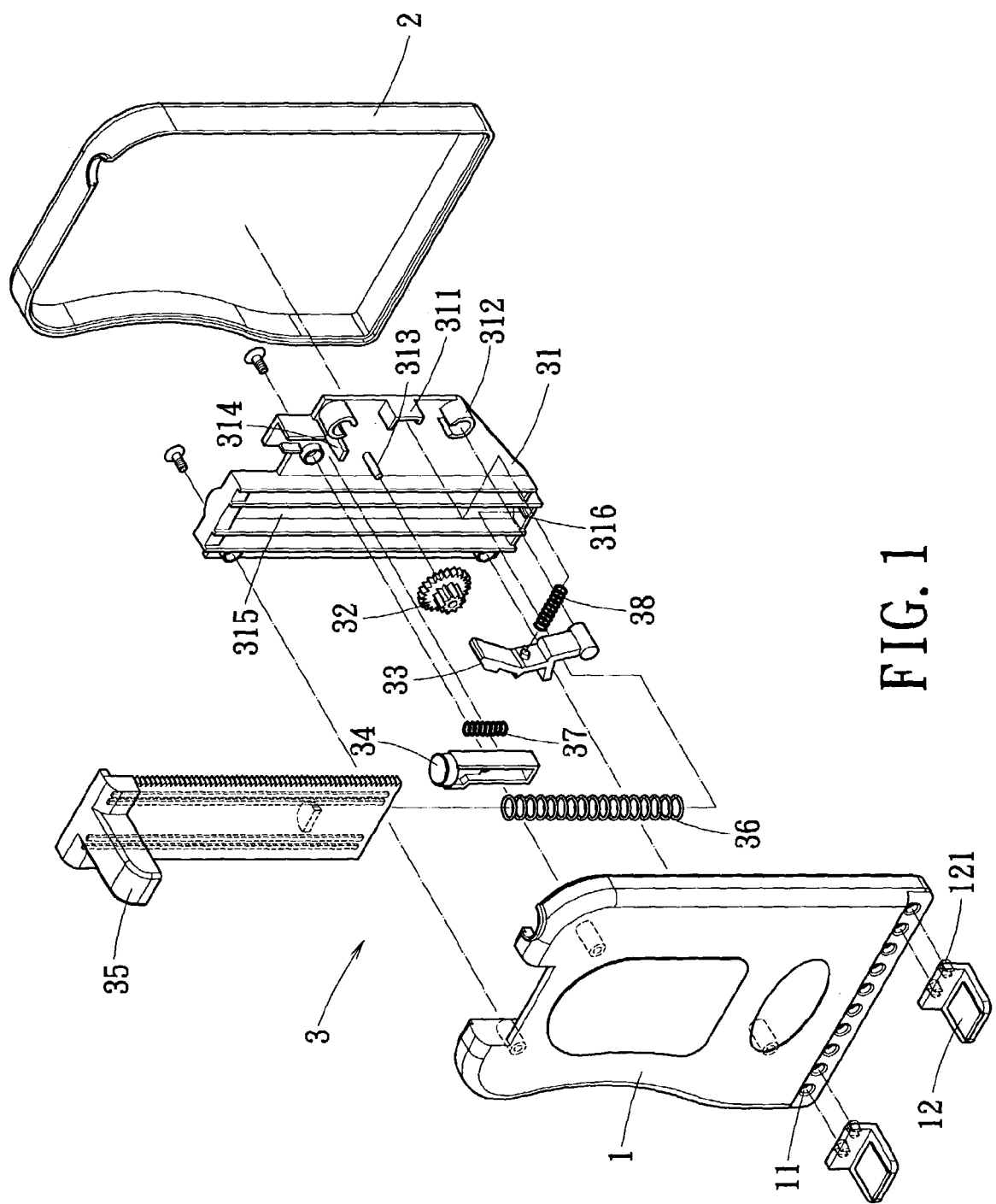
FIG. 1 is an exploded view of an attachment assembly according to one embodiment of the invention.

Wherever possible in the following description, like reference numerals will refer to like elements and parts unless otherwise illustrated.

Referring to FIG. 1 to FIG. 8, the invention provides an attachment assembly for attaching a personal digital assistant (PDA) in a car vehicle, which may be of different types. The attachment assembly includes a first cover portion 1, a second cover portion 2 and an attachment unit 3.

Figure 7:
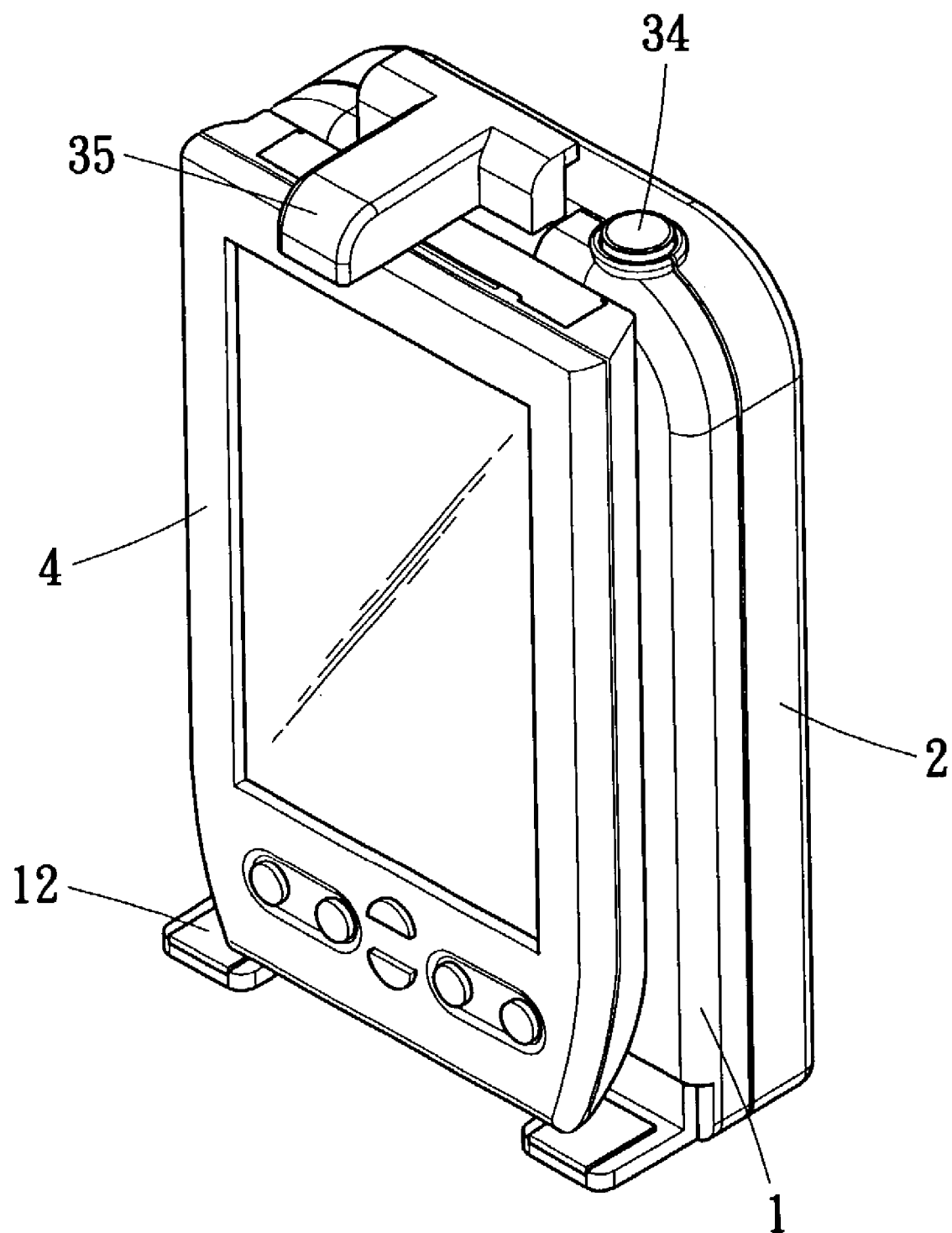
FIG. 7 is a perspective view of an attachment assembly receiving a PDA according to one embodiment of the invention.

As shown in FIG. 7, a PDA 4 is held at a front surface of the first cover portion 1. A plurality of fastening holes 11 are formed on and near a bottom edge of the front surface of the first cover portion 1. To hold the PDA 4, a plurality of L-shaped attachment arms 12 are respectively fastened to the front surface of the first cover portion by respectively inserting plugs 121 into the corresponding fastening holes 11. The respective locations of the attachment arms 12 are adjustable according to the size of the PDA 4.

Figure 3:
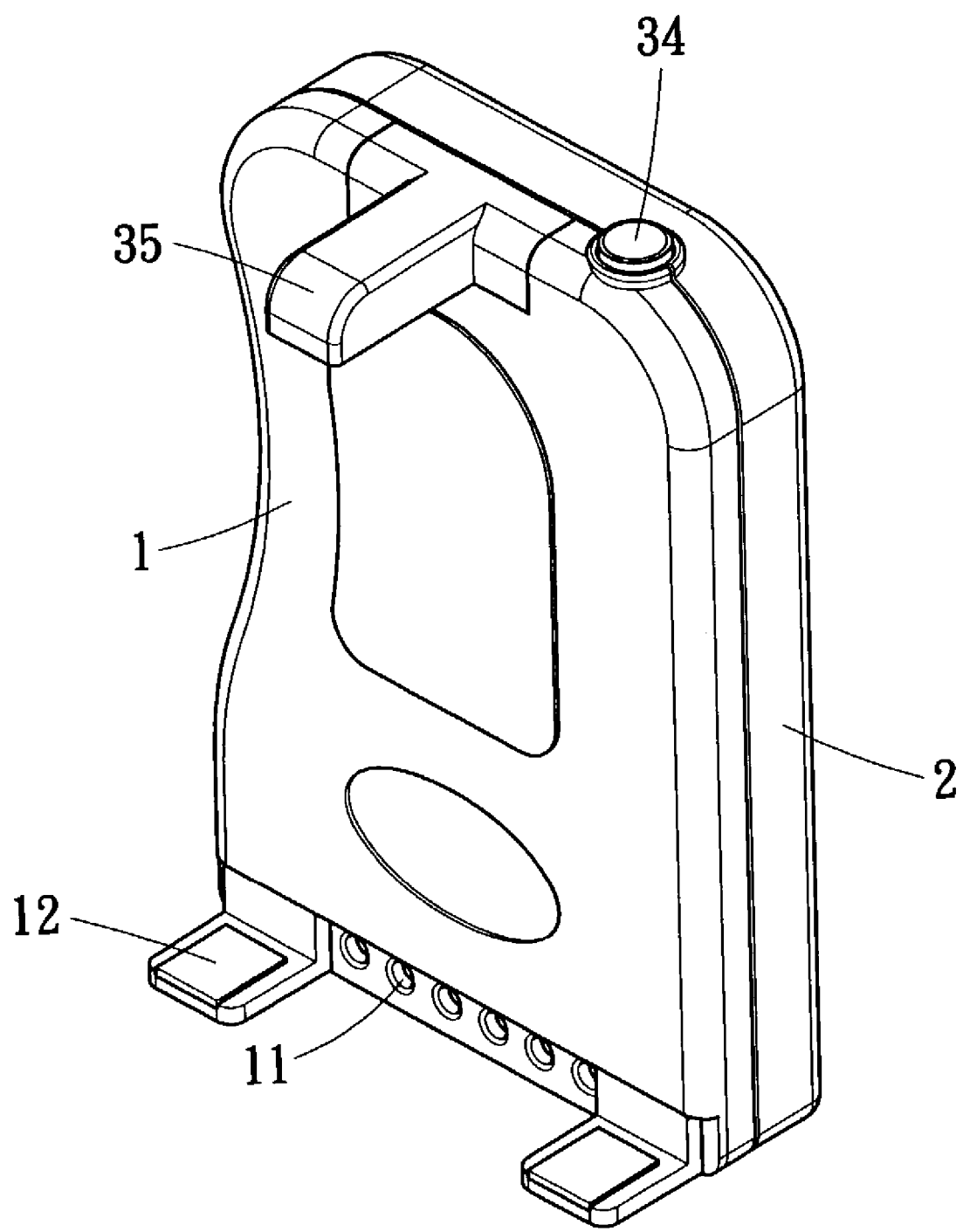
FIG. 3 is a perspective view of an attachment assembly according to one embodiment of the invention.

As shown in FIG. 3, the first and second cover portions 1, 2 are symmetrically arranged to accommodate the attachment unit 3 therein. A backside of the second cover portion 2 is fastened to a proper location of a vehicle by any conventional fastener (not shown). The vehicle driver thereby easily operates the PDA 4 to perform any desirable function of the PDA such as a calculating function, an electronic map function, a document processing function, an electronic book function, or receive various online information such as finance, traffic, weather and news information.

The attachment unit 3 further includes an attachment body 31 that is connected to a gear 32, a lock 33, a pressing button 34, a fastening frame 35, a long resilient member 36, a first short resilient member 37 and a second short resilient member 38.

Figure 2:
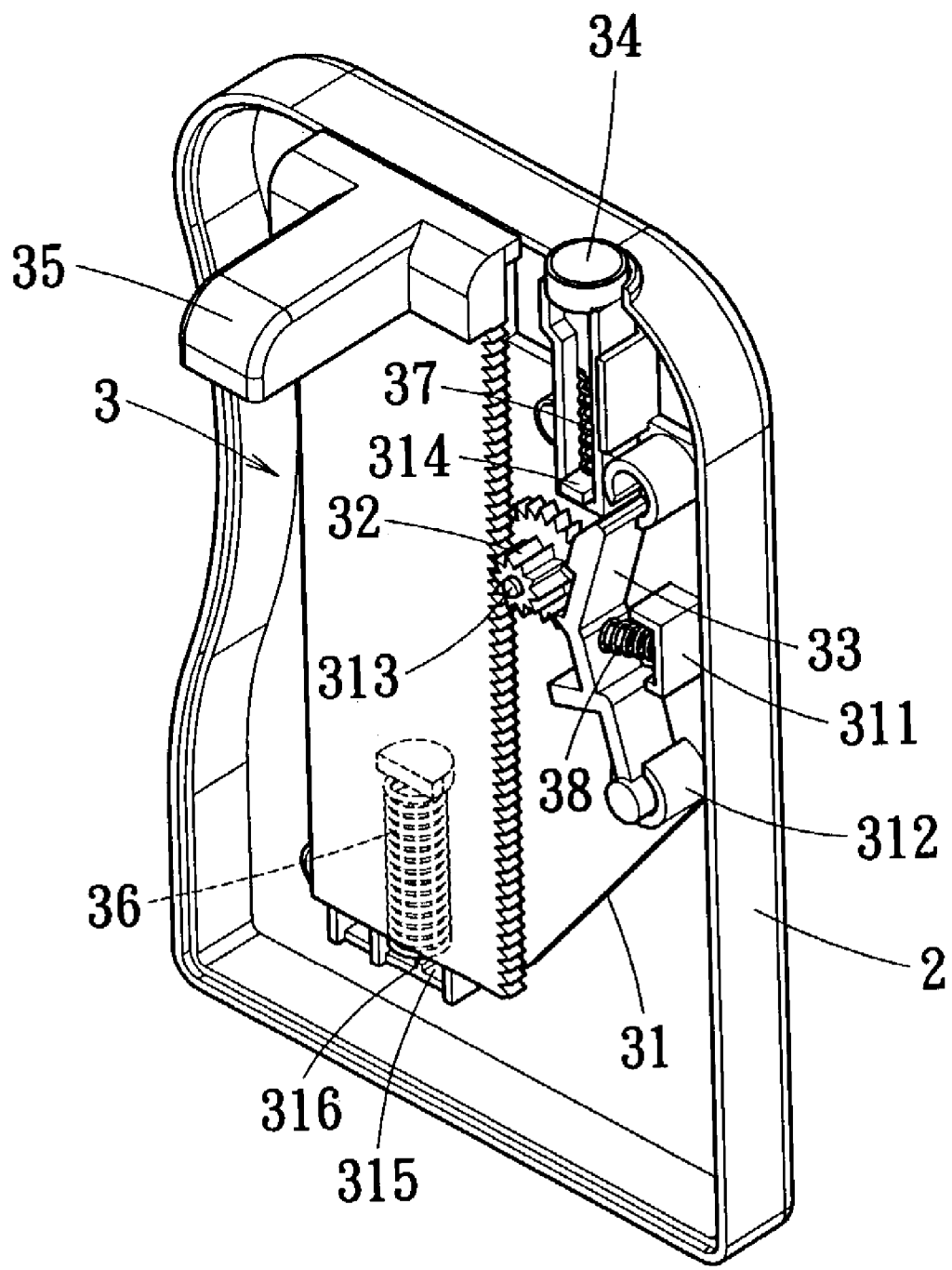
FIG. 2 is a perspective view of an attachment unit assembled with a second cover portion according to one embodiment of the invention.
Figure 4:
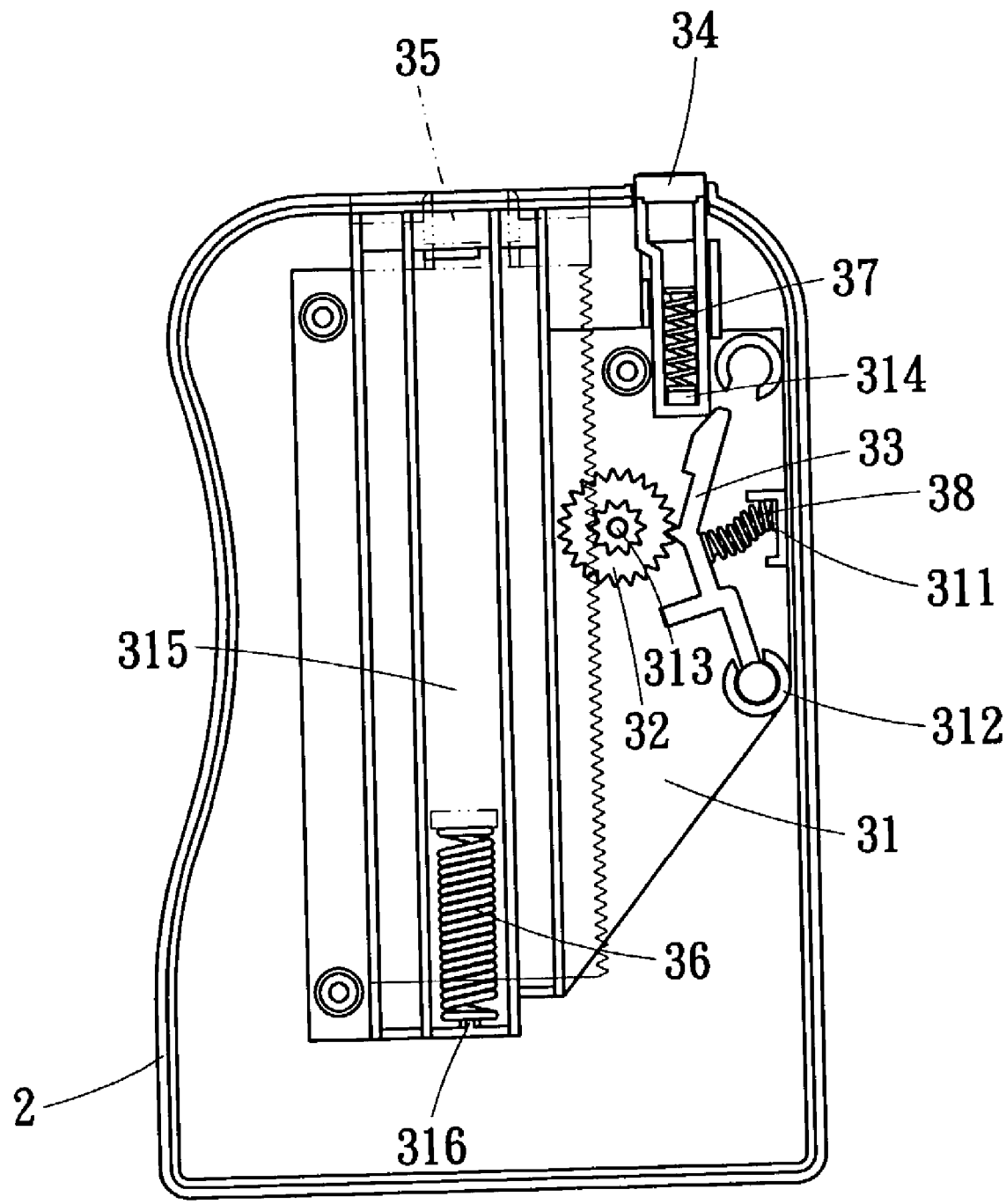
FIG. 4 is a cross-sectional view of an attachment assembly according to one embodiment of the invention.

The attachment body 31 is integrally injection molded and has a first side and a second side opposite to the first side. With reference to FIG. 2 and FIG. 4, a projection piece 311, an opened ring 312, a rod 313 and a stopper piece 314 are formed at the first side of the attachment body 31. The projection piece 311 receives the second short resilient member 38. The opened ring 312 receives one end of the lock 33. The gear 32 is pivotally assembled via the rod 313, and the lock 33 has a first portion that movably engages with the gear 32 to obstruct the rotation of the gear 32 or disengage to allow a movement of the gear 32. The stopper piece 314 receives the mount of both pressing button 34 and first short resilient member 37 in a manner that the pressing button 34 is in contact with a second portion of the lock 33.

A slot 315 is formed at the second side of the attachment body 31. As shown in FIG. 4, a stud 316 is formed at an inner bottom of the slot 31. The slot 315 receives the fastening frame 35 and the long resilient member 36. The stud 316 serves to position the long resilient member 36.

Figure 5:
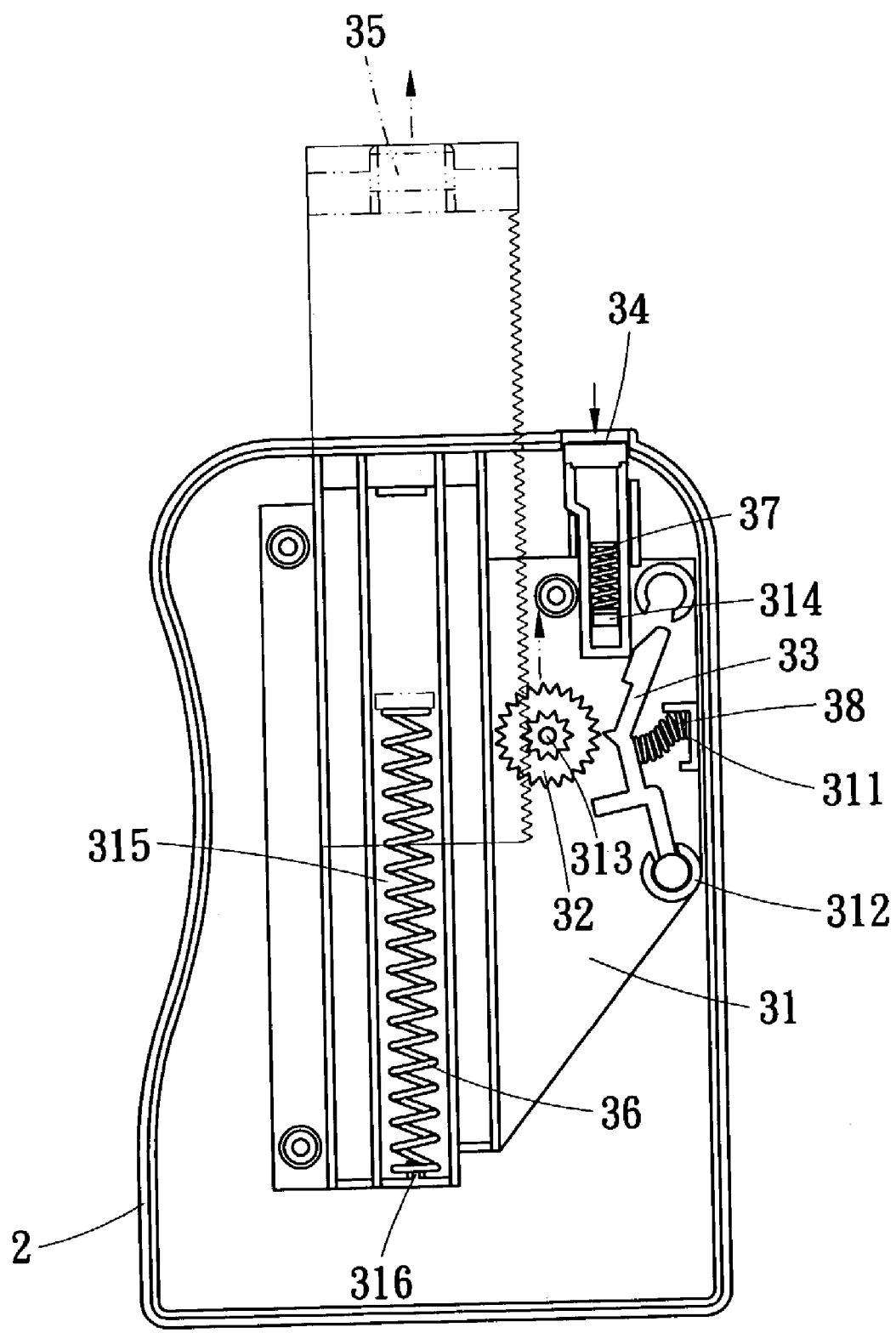
FIG. 5 is a schematic view illustrating the operation of an attachment assembly according to one embodiment of the invention.
Figure 6:
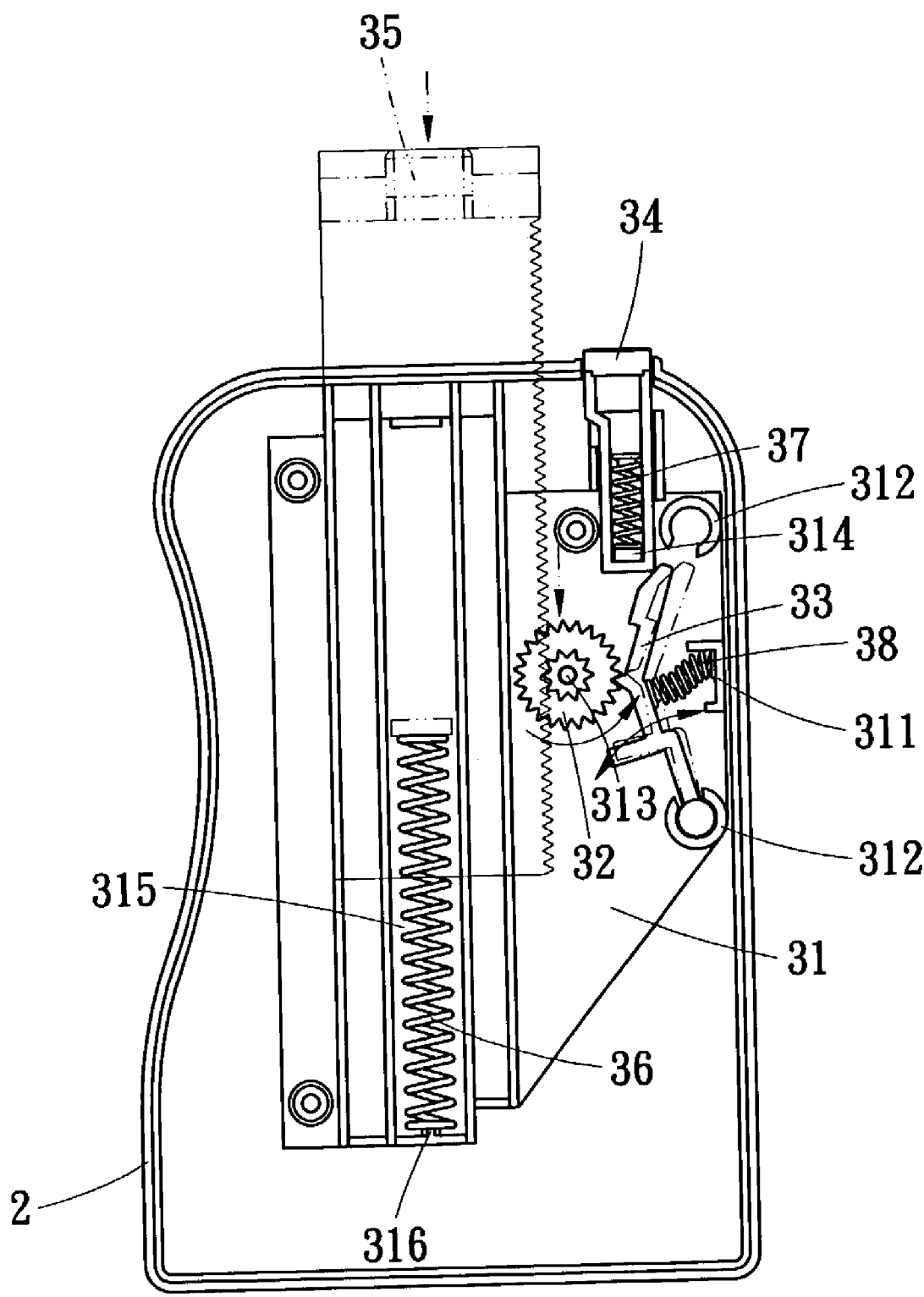
FIG. 6 is another schematic view illustrating the operation of an attachment assembly according to one embodiment of the invention.

Referring to FIG. 5 to FIG. 7, when the PDA 4 is to be put in the attachment assembly, the user just presses down the pressing button 34 to movably bias the lock 33 away from the gear 32, as shown in FIG. 5. At this moment, the resilient force of the long resilient member 36 urges the fastening frame 35, upward to enlarge the accommodating space of the front surface of the first cover portion 1, which allows the user to easily put in place the PDA 4. The fastening frame 35 can be adequately adjusted to match with the size of the PDA 4 for optimal fastening or easy retrieval.

Figure 8:
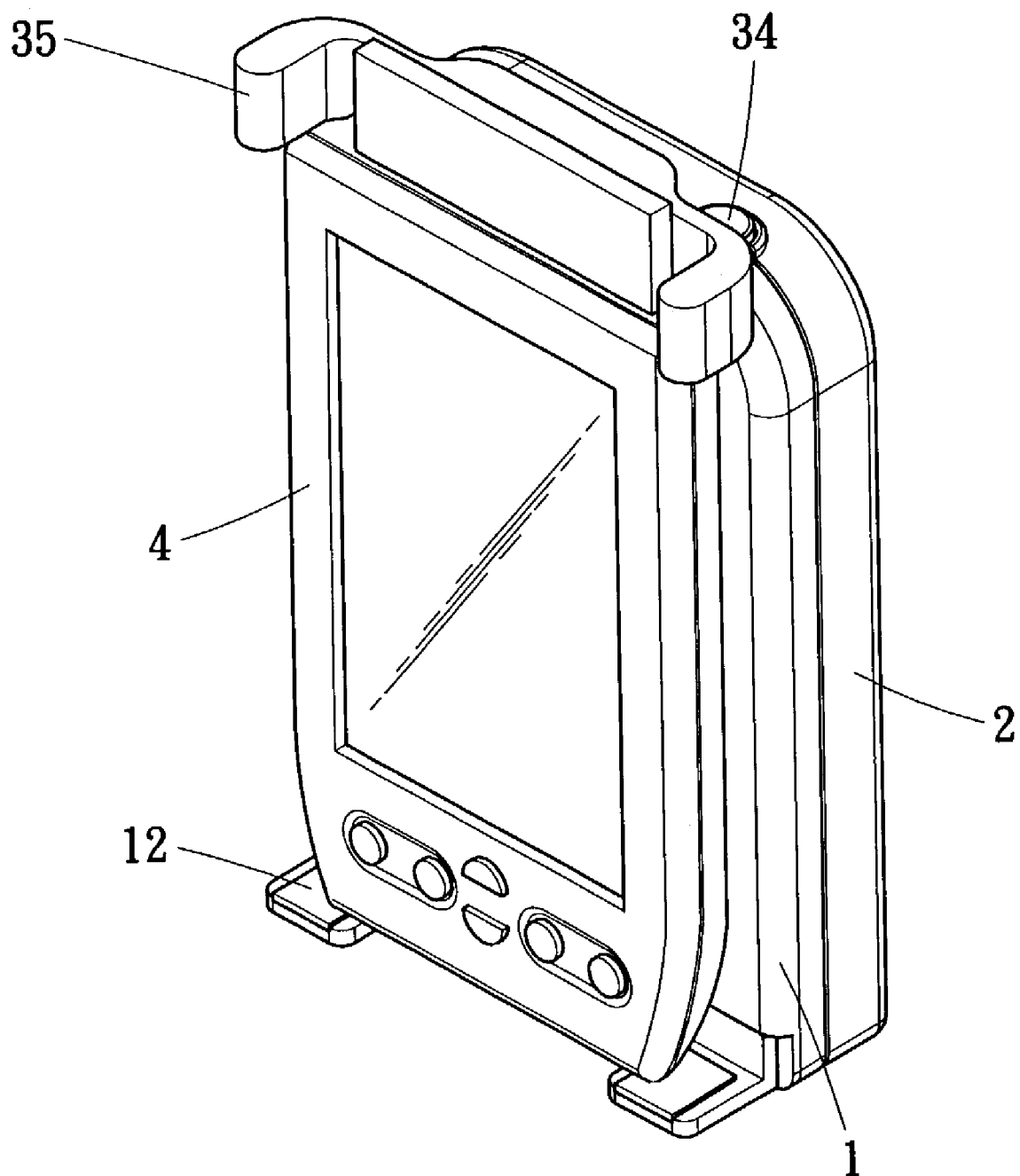
FIG. 8 is a perspective view of an attachment assembly receiving a PDA according to another embodiment of the invention.

Referring to FIG. 8, the fastening frame 35 is, for example, U-shaped or reversed L-shaped. However, the fastening frame 35 may have any adequate shape to securely accommodate and hold different sizes of PDA 4.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. An attachment assembly for a personal digital assistant (PDA), the attachment assembly comprising:
   a first cover portion, including a front surface adapted to hold a PDA, wherein a plurality of attachment arms are respectively fastened to the front surface of the first cover portion;
   a second cover portion, symmetrically arranged with the first cover portion; and
   an attachment unit, accommodated between the first and second cover portions and including an attachment body that has a first side and a second side, wherein a projection piece, an opened ring, a rod and a stopper piece are formed at the first side of the attachment body to mount with a gear, a lock, a pressing button, a fastening frame, a long resilient member, a first short resilient member and a second short resilient member, a slot being formed at the second side of the attachment body, a stud being formed on an inner bottom of the slot, the slot receiving the fastening frame and the long resilient member, the fastening frame being positioned by the long resilient member.

2. The attachment assembly of claim 1, wherein a plurality of fastening holes are formed on the front surface and near a bottom edge of the front surface to locate the attachment arms for different-sizes of PDA.

3. The attachment assembly of claim 1, wherein a backside of the second cover portion is adapted to be fastened to a proper location of a vehicle by a fastener.

4. The attachment assembly of claim 1, wherein the fastening frame is U-shaped or reversed L-shaped so that different sizes of PDA are allowed to have a secure holding.

* * * * *